United States Patent
Kuh et al.

(10) Patent No.: US 8,970,039 B2
(45) Date of Patent: Mar. 3, 2015

(54) INTEGRATED CIRCUIT DEVICES INCLUDING ELECTRODE SUPPORT STRUCTURES AND METHODS OF FABRICATING THE SAME

(71) Applicant: Samsung Electronics Co., Ltd., Suwon-si (KR)

(72) Inventors: Bong-jin Kuh, Gyeonggi-do (KR); Sang-ryol Yang, Gyeonggi-do (KR); Soon-wook Jung, Gyeonggi-do (KR); Young-sub You, Gyeonggi-do (KR); Byung-hong Chung, Seoul (KR); Han-mei Choi, Seoul (KR); Jong-sung Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 161 days.

(21) Appl. No.: 13/707,394

(22) Filed: Dec. 6, 2012

(65) Prior Publication Data

US 2013/0147048 A1 Jun. 13, 2013

(30) Foreign Application Priority Data

Dec. 7, 2011 (KR) .......................... 10-2011-0130478

(51) Int. Cl.
| | | |
|---|---|---|
| *H01L 23/12* | (2006.01) | |
| *H01L 23/48* | (2006.01) | |
| *H01L 29/40* | (2006.01) | |
| *H01L 23/498* | (2006.01) | |
| *H01L 27/108* | (2006.01) | |
| *H01L 49/02* | (2006.01) | |

(52) U.S. Cl.
CPC .... *H01L 23/49827* (2013.01); *H01L 27/10814* (2013.01); *H01L 27/10852* (2013.01); *H01L 28/91* (2013.01); *H01L 27/10876* (2013.01); *H01L 27/10891* (2013.01); *H01L 2924/0002* (2013.01)
USPC .................................. 257/758; 257/E27.084

(58) Field of Classification Search
USPC .......................... 257/296, 300, 758, E27.084
See application file for complete search history.

(56) References Cited

U.S. PATENT DOCUMENTS

| 2012/0119283 A1* | 5/2012 | Lee et al. ...................... 257/316 |
| 2013/0065381 A1* | 3/2013 | Son et al. ...................... 438/479 |
| 2013/0175603 A1* | 7/2013 | Cho et al. ...................... 257/324 |
| 2014/0042520 A1* | 2/2014 | Lee et al. ...................... 257/324 |
| 2014/0054675 A1* | 2/2014 | Lee et al. ...................... 257/324 |
| 2014/0054676 A1* | 2/2014 | Nam et al. ...................... 257/324 |

FOREIGN PATENT DOCUMENTS

| KR | 10-2008-0065123 A | 7/2008 |
| KR | 10-2009-0068774 A | 6/2009 |
| KR | 10-2011-0078064 A | 7/2011 |

* cited by examiner

*Primary Examiner* — S. V. Clark
(74) *Attorney, Agent, or Firm* — Myers Bigel Sibley & Sajovec, PA

(57) ABSTRACT

A semiconductor device includes a plurality of electrode structures perpendicularly extending on a substrate, and at least one support unit extending between the plurality of electrode structures. The support unit includes at least one support layer including a noncrystalline metal oxide contacting a part of the plurality of electrode structures. Related devices and fabrication methods are also discussed.

15 Claims, 12 Drawing Sheets

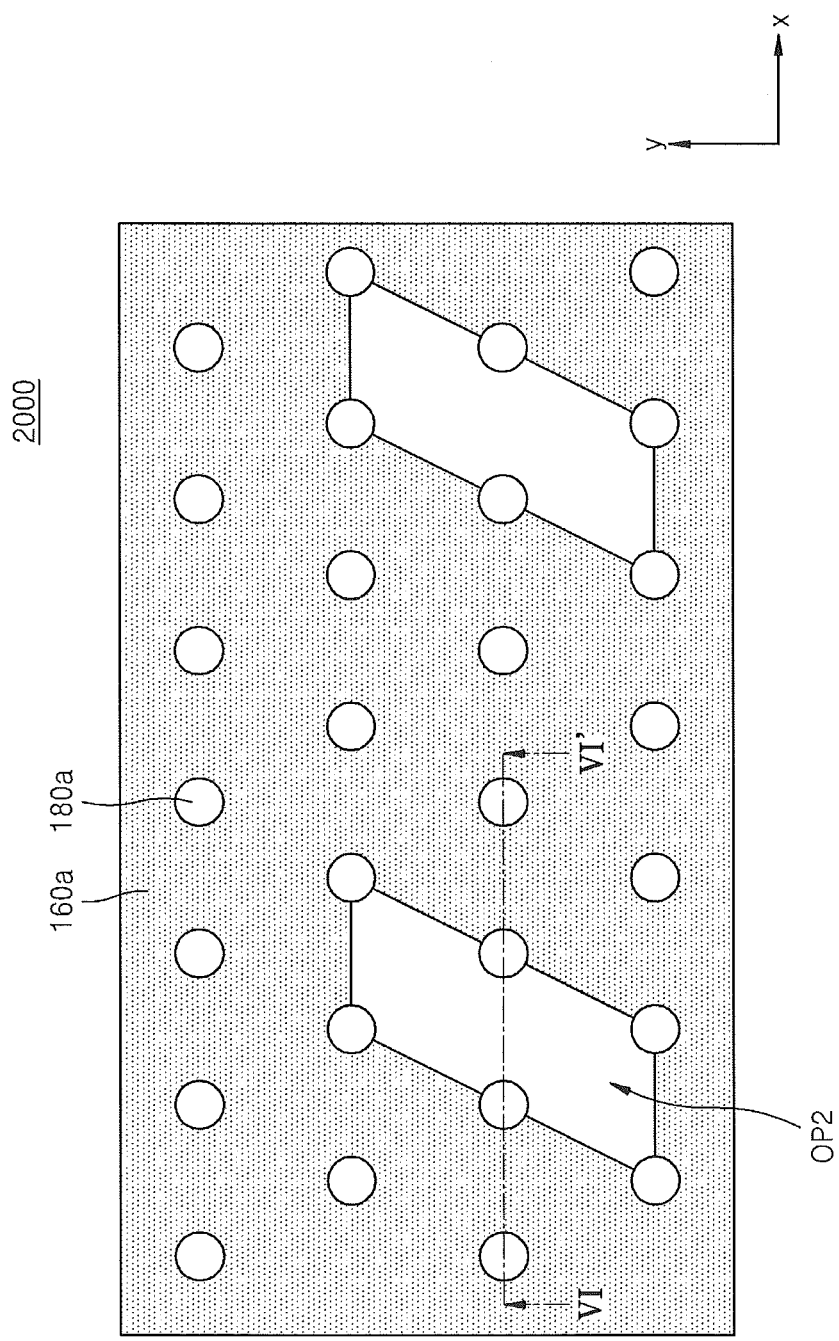

US 8,970,039 B2

INTEGRATED CIRCUIT DEVICES INCLUDING ELECTRODE SUPPORT STRUCTURES AND METHODS OF FABRICATING THE SAME

CROSS-REFERENCE TO RELATED APPLICATIONS

This application claims priority under 35 U.S.C. §119 to Korean Patent Application No. 10-2011-0130478, filed on Dec. 7, 2011, in the Korean Intellectual Property Office, the disclosure of which is incorporated herein in its entirety by reference.

BACKGROUND

The inventive concept relates to integrated circuit devices, and more particularly, to integrated circuit devices including capacitors.

In integrated circuit devices, such as dynamic random access memory (DRAM), there is demand for increasing a degree of integration and decreasing an area occupied by the integrated circuit devices, while maintaining or increasing capacitances. A method of forming a three-dimensional lower electrode of a capacitor and increasing a height of the lower electrode can be used to achieve these goals, since a dielectric film can be continuously used in such a process. The lower electrode may be formed as a cylinder or pillar type.

SUMMARY

Embodiments of the inventive concept provide a semiconductor or other integrated circuit device having improved reliability.

According to some aspects, an integrated circuit device includes a plurality of electrode structures on a substrate, where the electrode structures protrude from a surface of the substrate. A support unit comprising noncrystalline metal oxide is spaced apart from the surface of the substrate. The support unit extends between ones of the electrode structures and contacts respective sidewalls thereof.

In some aspects, the support unit may be a heterogeneous material including metal or silicon. The metal or silicon may be a dopant that is configured to increase a crystallization temperature of the metal oxide.

In some aspects, the support unit may be a multi-layer structure having a first layer including the metal oxide and a second layer including a different material than the first layer. The second layer may have a lower adhesive strength than the first layer with respect to the electrode structures.

In some aspects, the first layer may contact the sidewalls of the electrode structures, and the second layer may be separated from the sidewalls of the electrode structures by the first layer.

In some aspects, the support unit may be a single layer of the metal oxide having a thickness that is sufficient to avoid crystallization during deposition thereof. For example, the support layer may have a thickness of less than about 500 Angstroms (Å).

In some aspects, the electrode structures may conform to a shape of a mold structure. The mold structure may be formed of a material having a crystallization temperature less than that of the metal oxide. For example, the mold structure may be amorphous silicon or polysilicon.

According to an aspect of the inventive concept, there is provided a semiconductor device including a plurality of electrode structures perpendicularly extending on a substrate, and at least one support unit disposed between the plurality of electrode structures. The support unit includes at least one first support layer contacting a part of the plurality of electrode structures and including a metal oxide, and at least one second support layer contacting the at least one first support layer, wherein the metal oxide includes noncrystalline metal oxide.

The at least one first support layer may have a smaller thickness than the at least one second support layer.

The at least one first support layer and the at least one second support layer may be alternately arranged.

The support unit may include a material having a lower etch rate than silicon with respect to an ammonium hydroxide ($NH_4OH$) solution.

The metal oxide may include at least one of titanium oxide (TiO), tantalum oxide (TaO), aluminum oxide (AlO), tantalum titanium oxide (TaTiO), and tantalum silicon oxide (TaSiO).

The at least one second support layer may include at least one of silicon oxide (SiO), silicon nitride (SiN), silicon carbon nitride (SiCN), silicon oxycarbide (SiOC), silicon oxynitride (SiON), and carbon doped silicon oxynitride (SiOCN).

The at least one second support layer may include a metal oxide different from the at least one first support layer.

An adhesive strength between the at least one first support layer and the plurality of electrode structures may be greater than that between the at least one second support layer and the plurality of electrode structures.

The at least one first support layer may have a thickness from 10 Å to 200 Å.

A plurality of the support units may be arranged at different heights from the substrate, and at least one of the plurality of support units may be disposed at or adjacent a top of the plurality of electrode structures.

The plurality of support units may have different thicknesses.

The plurality of electrode structures may include ruthenium oxide.

According to another aspect of the inventive concept, there is provided a semiconductor device including a plurality of electrode structures perpendicularly extending on a substrate, and at least one support unit disposed between the plurality of electrode structures. The support unit includes a plurality of first support layers contacting a part of the plurality of electrode structures and including a metal oxide, and a second support layer contacting the plurality of first support layers and spaced apart from the plurality of electrode structures, wherein the metal oxide includes noncrystalline metal oxide.

The at least one support unit may be disposed at a location spaced apart from two ends of the plurality of electrode structures in a perpendicular direction.

According to another aspect of the inventive concept, there is provided a semiconductor device including a plurality of electrodes perpendicularly extending on a substrate, and a support unit disposed between the plurality of electrode structures while contacting a part of the plurality of electrode structures, the support unit including a noncrystalline metal oxide.

BRIEF DESCRIPTION OF THE DRAWINGS

Exemplary embodiments of the inventive concept will be more clearly understood from the following detailed description taken in conjunction with the accompanying drawings in which:

FIG. 4 is a plan view schematically illustrating an arrangement of electrode structures and a support unit of a semiconductor device, according to further embodiments of the inventive concept;

DETAILED DESCRIPTION OF THE EMBODIMENTS

Figure 1:
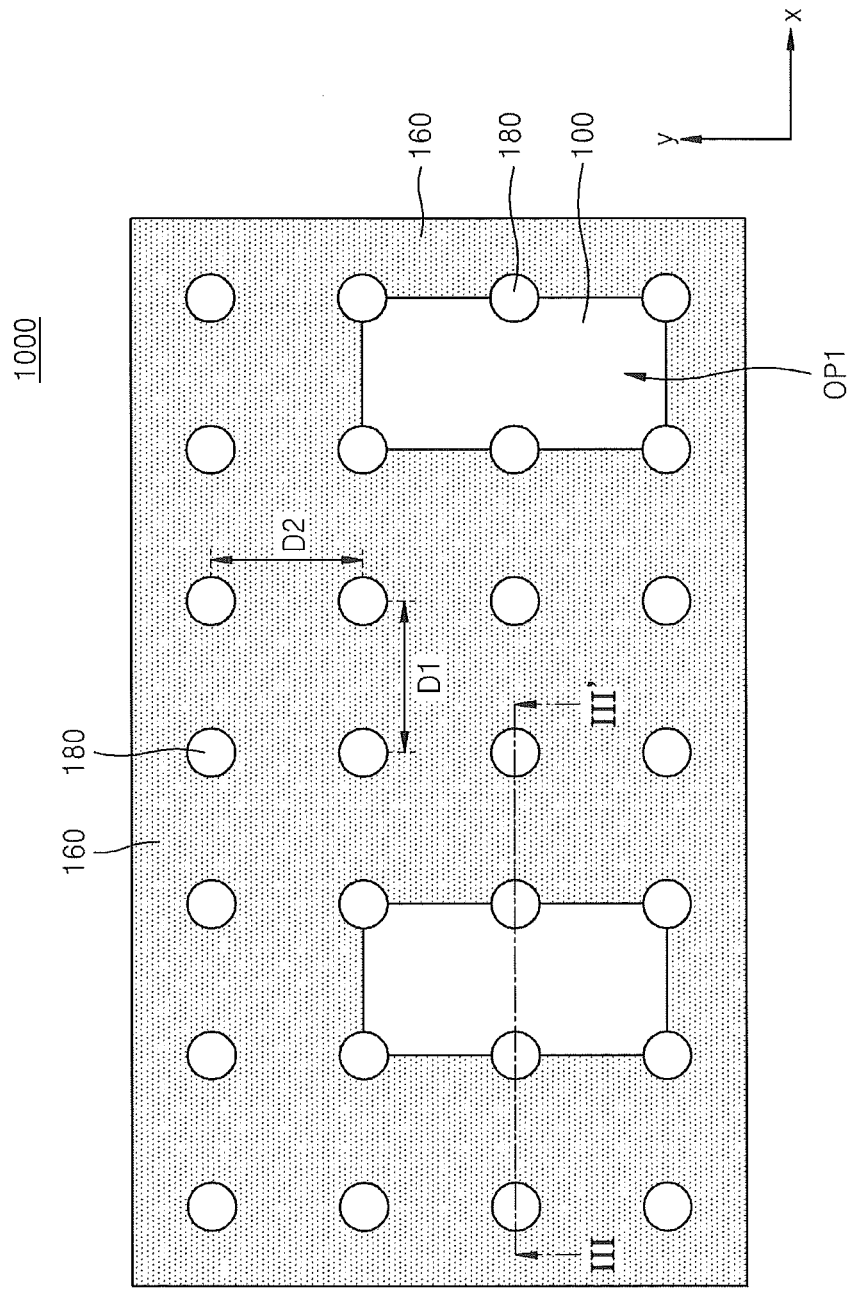
FIG. 1 is a plan view schematically illustrating an arrangement of electrode structures and a first support unit of a semiconductor device, according to some embodiments of the inventive concept.

Hereinafter, the present inventive concept will be described more fully with reference to the accompanying drawings, in which exemplary embodiments of the invention are shown. This inventive concept may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. As used herein, the term "and/or" includes any and all combinations of one or more of the associated listed items. Expressions such as "at least one of," when preceding a list of elements, modify the entire list of elements and do not modify the individual elements of the list.

The terms "first," "second," and the like, and "primary," "secondary," and the like, as used herein do not denote any order, quantity, or importance, but rather are used to distinguish one element, region, component, layer, or section from another.

In drawings, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the drawings, like reference numerals denote like elements. Further, various elements and regions are schematically illustrated, and thus are not limited by relative sizes or intervals illustrated.

It will be understood that when an element or layer is referred to as being "on," "connected to," "coupled to," or "adjacent" another element or layer, it can be directly on, connected to, coupled to, or adjacent the other element or layer, or intervening elements or layers may be present. In contrast, when an element is referred to as being "directly on," "directly connected to," "directly coupled to," or "directly adjacent" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly.

Like reference numerals designate like elements throughout the specification. Therefore, even though identical or similar reference numerals are not described in the corresponding drawing, they may be described with reference to the other drawings. Also, even though no reference numeral is indicated, it may be described with reference to the other drawings.

Unless otherwise defined, all terms used in disclosing embodiments of the inventive concept, including technical and scientific terms, have the same meaning as commonly understood by one of ordinary skill in the art to which this invention belongs, and are not necessarily limited to the specific definitions known at the time of the present inventive concept being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein.

Figure 2:
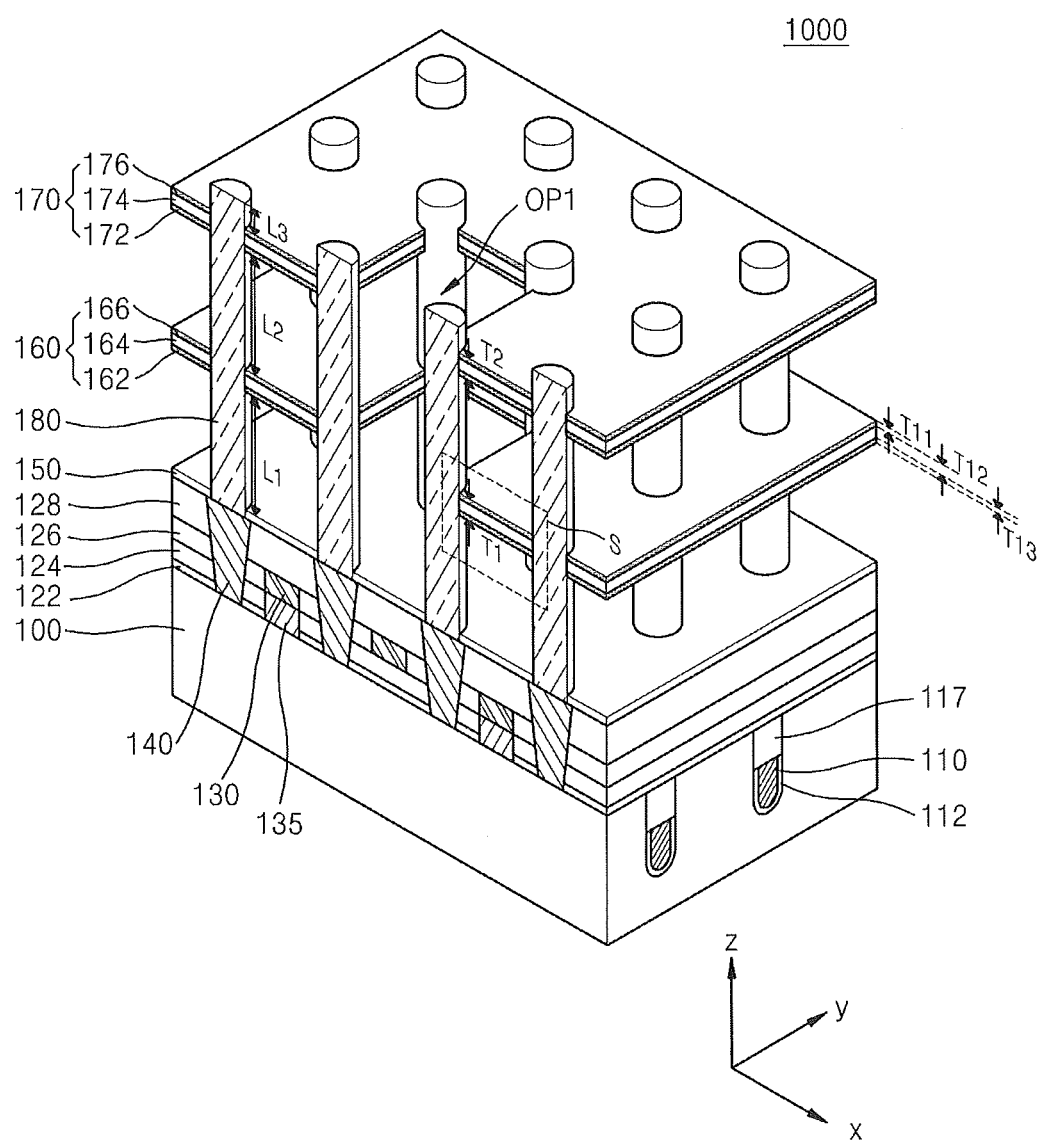
FIG. 2 is a perspective view schematically illustrating the semiconductor device of FIG. 1.

FIG. 1 is a plan view schematically illustrating an arrangement of electrode structures 180 and a first support unit 160 of an integrated circuit device, in particular a semiconductor device 1000, according to some embodiments of the inventive concept. FIG. 2 is a perspective view schematically illustrating the semiconductor device 1000 of FIG. 1. A structure of the semiconductor device 1000 shown in FIGS. 1 and 2 may be applied to a cell array region of a dynamic random access memory (DRAM), but is not limited thereto.

Referring to FIGS. 1 and 2, the semiconductor device 1000 includes a plurality of gate lines 110 in a substrate 100, a plurality of bit lines 130, and the plurality of electrode structures 180 on the substrate 100 and protruding from a surface thereof.

The substrate 100 may include a semiconductor material such as silicon or silicon-germanium, and may further include an epitaxial layer, a silicon on insulator (SOI) layer, or a semiconductor on insulator (SeOI) layer. The substrate 100 may include element isolating layers (not shown) for isolating the gate lines 110 and the bit lines 130.

The gate lines 110 may be disposed to extend in one direction, for example, in an x-direction, in the substrate 100. The gate lines 110 may be disposed between the adjacent electrode structures 180 arranged along a y-direction. The gate lines 110 may be buried word lines forming a buried channel array transistor (BCAT). A gate insulation layer 112 may be formed on a side wall of the gate line 110, and the gate line 110 may be formed on the gate insulation layer 112 and lower than/below the top surface of the substrate 100. However, the gate line 110 may be disposed on the substrate 100 according to other embodiments.

The gate insulation layer 112 may be formed of oxide, nitride, or oxynitride. Also, the gate insulation layer 112 may include silicon oxide or another insulation material having high dielectric constant. The gate line 110 may be formed of a metal, metal nitride, or doped polysilicon. For example, the gate line 110 may be formed of titanium nitride (TiN) in some embodiments. The tops of the gate lines 110 may be covered by a capping layer 117. The capping layer 117 may be formed of silicon nitride in some embodiments.

First through fourth insulation layers 122 through 128 may be formed on top of the substrate 100. The bit lines 130 may extend in a direction perpendicular to the gate lines 110, for example, in the y-direction, in the third insulation layer 126. One or more of the bit lines 130 may be arranged as a buried bit line in the substrate 100 according to other embodiments. A bit line 130 may be electrically connected to the substrate 100 via a direct contact plug 135. The bit line 130 and the direct contact plug 135 may be respectively formed of a conductive material, such as doped polysilicon or tungsten (W).

The electrode structures 180 may be repeatedly arranged on the substrate 100 along the x-direction and y-direction, as shown in FIG. 1. As shown in FIG. 1, the electrode structures 180 may be spaced apart from each other by a first pitch D1 in the x-direction and by a second pitch D2 in the y-direction. The first and second pitches D1 and D2 are illustrated as being a same size in FIG. 1 by way of example, but alternatively, may be different sizes from each other.

The electrode structure 180 may have a thin and long shape (e.g., an elongated shape) extending in a direction perpendicular to the x- and y-directions, for example, protruding in a z-direction, on the substrate 100. An aspect ratio, i.e., a ratio of height to width, of the electrode structure 180 may be in the range of about 10 to about 35.

In the embodiments of FIGS. 1 and 2, the electrode structure 180 has a pillar shape, i.e., a column shape, but alternatively, the electrode structure 180 may have a cylinder shape. In the present specification, the term "pillar shape" denotes a solid column shape as shown in FIG. 2, while the term "cylinder shape" may denote a solid or hollow shape. The electrode structure 180 may include at least one of, for example, doped polysilicon, titanium nitride (TiN), tungsten (W), titanium (Ti), ruthenium (Ru), and tungsten nitride (WN). Specifically, the electrode structure 180 may include a conductive oxide-based material, such as ruthenium oxide ($RuO_x$).

The electrode structure 180 may be connected to a source/drain region of the gate line 110 in the substrate 100, via a capacitor contact plug 140 in a predetermined region. In the embodiments of FIGS. 1 and 2, the electrode structure 180 is directly connected to the substrate 100 via the capacitor contact plug 140, but alternatively, the electrode structure 180 may be connected to the substrate 100 via at least one of a contact pad (not shown) and/or at least one contact plug (not shown).

The number of electrode structures 180 may be more or less than that shown in FIG. 1. In the embodiments of FIGS. 1 and 2, the electrode structure 180 may correspond to a lower electrode of a capacitor. However, the present inventive concept is not limited to a lower electrode of a cell capacitor of a DRAM, but may also be applied to other structures that have high aspect ratios and are repeatedly arranged.

The first support unit 160 and a second support unit 170 may be disposed between the electrode structures 180. The first and second support units 160 and 170 may prevent and/or reduce the likelihood of the electrode structures 180 having high aspect ratios from being tilted. The first and second support units 160 and 170 support the electrode structure 180 by partially contacting a side of each electrode structure 180. The first and second support units 160 and 170 may have a planar or plate shape that extends substantially parallel to the top surface of the substrate 100, and may be spaced apart from the surface of the substrate 100 at respective predetermined heights L1 and L2 of the electrode structure 180.

The first and second support units 160 and 170 may include one or more openings therein, such as an open region OP1. The open region OP1 may be repeatedly and regularly formed in the first and second support units 160 and 170. The open region OP1 may have a dimension in the x-direction corresponding to the first pitch D1, and a dimension in the y-direction corresponding to double the second pitch D2 (D2×2), i.e., a rectangular shape. One or more follow-up processes may be performed even on a portion of the electrode structure 180 below the first and second support units 160 and 170 through the open region OP1. For example, if the electrode structure 180 is a lower electrode of a cell capacitor of a DRAM, a dielectric layer 185 of FIG. 3H and an upper electrode 187 of FIG. 3H may be formed on the surface of the electrode structure 180 via the follow-up process(es). As such, the open region(s) OP1 may allow for the performance of subsequent fabrication processes after the support units 160 and/or 170 have been formed.

As shown in FIG. 2, the first and second support units 160 and 170 may be disposed at respective predetermined heights of the electrode structure 180. For example, the first support unit 160 may be spaced apart from both ends of the electrode structure 180 in the z-direction, and thus may be disposed below the center of the electrode structure 180. Also, the second support unit 170 may be disposed at the upper portion of the second support unit 170, i.e., above the center of the electrode structure 180. Accordingly, the electrode structure 180 may be exposed by a first length L1 at the bottom of the first support unit 160, and exposed by a second length L2 between the first and second support units 160 and 170. The first length L1 may be identical to or larger than the second length L2. Also, the electrode structure 180 may be exposed by a third length L3 at the top of the second support unit 170. The third length L3 may be smaller than the first and second lengths L1 and L2.

Alternatively, the second support unit 170 may be disposed at the same height as the top of the electrode structure 180 so that the electrode structure 180 does not protrude above the top of the second support unit 170. Here, the numbers of the first and second support units 160 and 170 are not limited to those shown in FIGS. 1 and 2, and may be at least three. In other words, while illustrated in FIGS. 1 and 2 as including two support units 160 and 170, it will be understood that embodiments of the inventive concept may include fewer or more support units.

In some embodiments, the first and/or second support units 160 and/or 170 may include multi-layer structures. In particular, as shown in FIG. 2, the first and second support units 160 and 170 may respectively include first support layers 162 and 172, second support layers 164 and 174, and third support layers 166 and 176. A thickness T1 of the first support unit 160 and a thickness T2 of the second support unit 170 may be the same as or different from each other. According to some embodiments, the thickness T2 of the second support unit 170 may be greater than the thickness T1 of the first support unit 160. Thus first and second support units 160 and 170 may each have a multi-layer structure, and may include at least 4 layers (not shown) according to other embodiments.

The first support layers 162 and 172, the second support layers 164 and 174, and the third support layers 166 and 176 may include a material that is not etched while wet-etching a mold material for forming the electrode structures 180. In other words, the first and second support units 160 and 170 may include a material having etch selectivity with respect to a material of a mold structure that is used to form the electrode structures 180. For example, if the mold material includes silicon (Si), the material that is not etched may include a material having a lower etch rate than silicon with respect to an $NH_4OH$ solution constituting an etchant.

In particular embodiments, the first support layers 162 and 172 and the third support layers 166 and 176 may include a metal oxide. The metal oxide may be transition metal oxide. The metal oxide may be at least one of titanium oxide (TiO), tantalum oxide (TaO), aluminum oxide (AlO), tantalum titanium oxide (TaTiO), and tantalum silicon oxide (TaSiO), and may be at least partially noncrystalline. If the electrode structure 180 includes ruthenium oxide ($RuO_2$), the metal oxide may improve an adhesive characteristic with respect to $RuO_2$. Also, if a noncrystalline metal oxide is used, a leakage current of the semiconductor device 1000 may be reduced. If the first support layers 162 and 172 and third support layers 166 and 176 include the metal oxide, thicknesses T11 and T13 thereof may each be in the range from about 10 Angstroms (Å) to about 200 Å, and for example, may be about 100 Å. If the thicknesses T11 and T13 of the first support layers 162 and 172 and the third support layers 166 and 176 are relatively large, the first support layers 162 and 172 and the third support layers 166 and 176 may be crystallized during formation.

The second support layers 164 and 174 may be formed of a different material from the first support layers 162 and 172 and the third support layers 166 and 176. For example, the second support layers 164 and 174 may include a noncrystalline material. The second support layers 164 and 174 may include at least one of silicon oxide (SiO), silicon nitride (SiN), silicon carbon nitride (SiCN), silicon oxycarbide (SiOC), silicon oxynitride (SiON), and carbon doped silicon oxynitride (SiOCN). The second support layers 164 and 174 may have a weaker adhesive characteristic with respect to $RuO_2$ than the first support layers 162 and 172 and the third support layers 166 and 176.

Thicknesses T12 of the second support layers 164 and 174 may be identical to or larger than the thicknesses T11 and T13 of the first support layers 162 and 172 and the third support layers 166 and 176. Accordingly, the second support layers 164 and 174 maintain the entire thicknesses T1 and T2 of the first and second support units 160 and 170 to a predetermined level while reducing the thicknesses T11 and T13 of the first support layers 162 and 172 and the third support layers 166 and 176 such that the first support layers 162 and 172 and the third support layers 166 and 176 may not be crystallized during formation. In other words, the thicknesses of the second support layers 164 and 174 may be selected to maintain the overall thicknesses T1 and T2 of the support units 160 and 170, respectively, while sufficiently reducing the thicknesses T11 and T13 of the first support layers 162 and 172 and the third support layers 166 and 176 to prevent crystallization thereof.

FIGS. 3A through 3H are cross-sectional views for describing a method of manufacturing a semiconductor device, according to some embodiments of the inventive concept. FIGS. 3A through 3H are cross-sectional views taken along a line of FIG. 1.

Figure 3A:
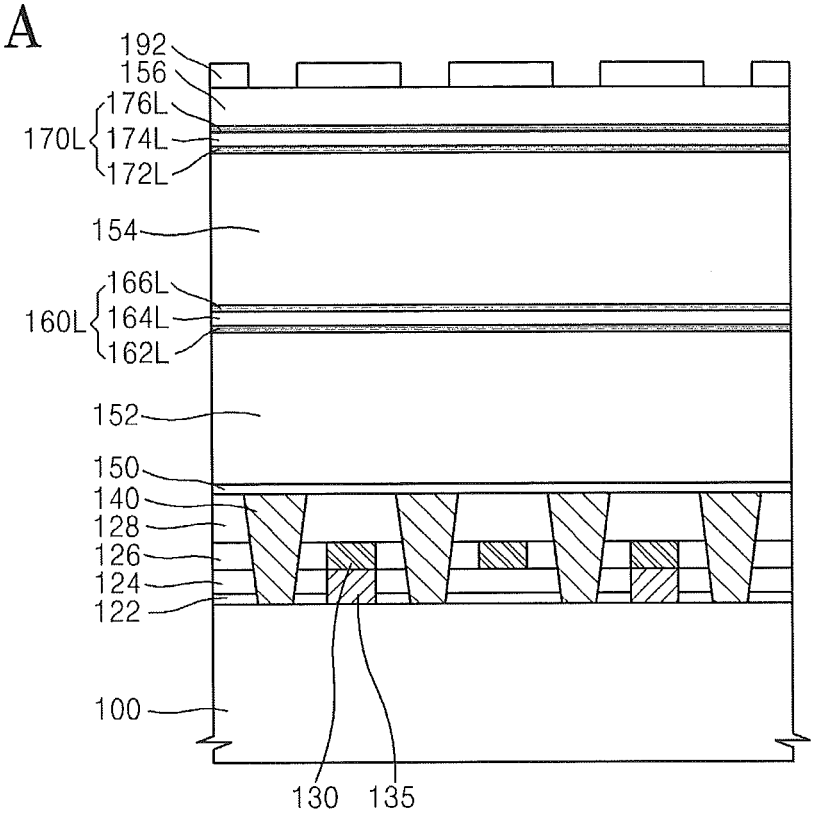
FIGS. 3A through 3H are cross-sectional views illustrating a method of manufacturing a semiconductor device, according to some embodiments of the inventive concept.

Referring to FIG. 3A, the substrate 100 where the gate lines 110 of FIG. 2, the bit lines 130, and the capacitor contact plugs 140 are formed is provided. A stacked structure where an etch stop layer 150, a first mold layer 152, a first support film 160L, a second mold layer 154, a second support film 170L, and a hard mask layer 156 are sequentially stacked is formed on the fourth insulation layer 128 and the capacitor contact plugs 140. A first mask pattern 192 for forming the electrode structure 180 of FIG. 2 may be formed on the stacked structure.

The first mold layer 152 and the second mold layer 154 may be formed of a material having a different etch selection ratio (or etch selectivity) with respect to the first and second support films 160L and 170L. The first and second mold layers 152 and 154 may be formed of polysilicon, amorphous silicon, or silicon germanium (SiGe). For example, if the first and second mold layers 152 and 154 are formed of polysilicon or amorphous silicon, the first and second support films 160L and 170L may include a material having an etch rate lower than silicon with respect to the $NH_4OH$ solution that is subsequently used as an etchant to remove the mold layers 152 and 154.

The first and second support films 160L and 170L respectively include first support plates or layers 162L and 172L, second support plates or layers 164L and 174L, and third support plates or layers 166L and 176L. The first support plates 162L and 172L and the third support plates 166L and 176L may include a noncrystalline metal oxide. The metal oxide may be at least one of titanium oxide (TiO), tantalum oxide (TaO), aluminum oxide (AlO), tantalum titanium oxide (TaTiO), and tantalum silicon oxide (TaSiO). Thicknesses of the first support plates 162L and 172L and the third support plates 166L and 176L may be respectively in the range from 10 Å to 200 Å, and, for example, may be 100 Å in some embodiments. The second support plates 164L and 174L may include at least one of silicon oxide (SiO), silicon nitride (SiN), silicon carbon nitride (SiCN), silicon oxycarbide (SiOC), silicon oxynitride (SiON), and carbon doped silicon oxynitride (SiOCN).

Here, if the first and second mold layers 152 and 154 are formed of polysilicon, the first and second mold layers 152 and 154 may be crystallized via a thermal process after forming an amorphous silicon layer. The thermal process may be performed at a temperature from about 600° C. to about 800° C. Alternatively, a separate thermal process may be omitted by depositing polysilicon at a temperature below or equal to 600° C. by using a low temperature crystallization process.

Figure 3B:
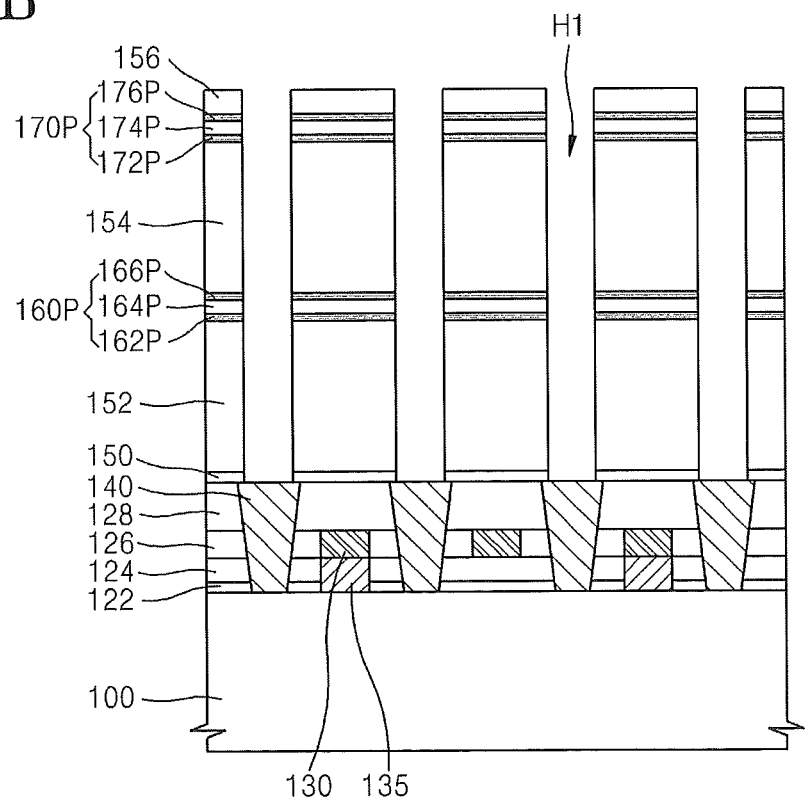

Referring to FIG. 3B, a plurality of first holes H1 may be formed by etching the hard mask layer 156, the second support film 170L, the second mold layer 154, the first support film 160L, and the first mold layer 152 at regions where the electrode structures 180 are to be formed. During the etching process, the etch stop layer 150 may be used to stop the etching process, and the etch stop layer 150 inside the first holes H1 is also removed to expose the capacitor contact plugs 140.

Parts of the first and second support films 160L and 170L are also removed by the first hole H1, and thus a first support pattern 160P and a second support pattern 170P are formed. The first and second support patterns 160P and 170P respectively include first support patterns 162P and 172P, second support patterns 164P and 174P, and third support patterns 166P and 176P. The first and second support patterns 160P and 170P thus define multi-layer patterns including holes or openings therein through which the electrode structures may extend.

Figure 3C:
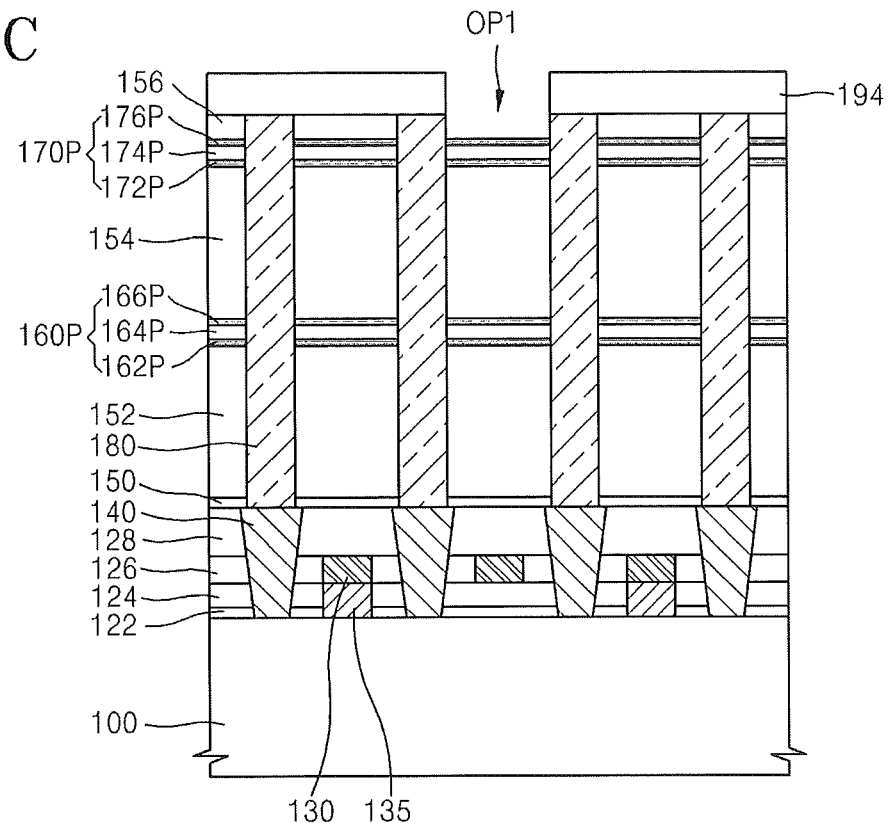

Referring to FIG. 3C, a conductive material is filled in the first holes H1 to define electrode structures 180 that conform to the shape of the holes H1 extending through the hard mask layer 156, the second support film 170L, the second mold layer 154, the first support film 160L, and the first mold layer 152. The conductive material may include at least one of doped polysilicon, SiGe, TiN, W, Ti, Ru, and WN. Specifically, the electrode structures 180 may include a conductive oxide-based material, such as $RuO_x$.

A second mask pattern 194 for forming the open region OP1 may be formed on the electrode structures 180 and the hard mask layer 156. The hard mask layer 156 is patterned by using the second mask pattern 194.

Figure 3D:
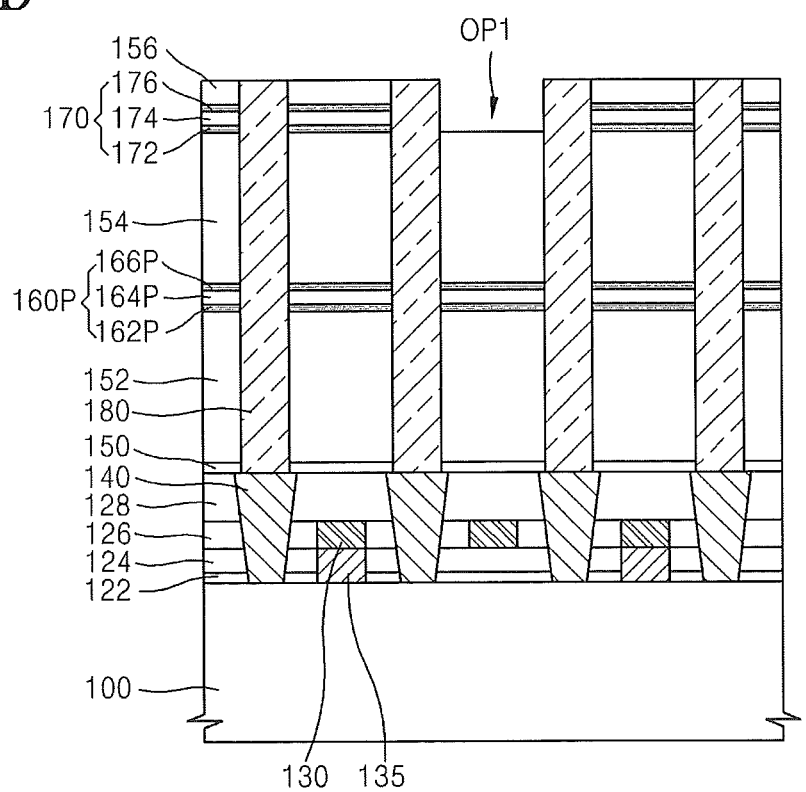

Referring to FIG. 3D, a portion of the second support pattern 170P that is exposed by the second mask pattern 194 is removed. The removing may be performed via dry etching. As shown in FIG. 1, the portion of the second support pattern 170P that is removed between the electrode structures 180 defines the open region OP1 in the second support unit 170. As such, the second support unit 170 is formed via the removing, and a part of the second mold layer 154 is exposed through the open region OP1. As shown in FIG. 1, a plurality of the open regions OP1 may be formed at regular or irregular intervals in the support units 160 and/or 170.

Figure 3E:
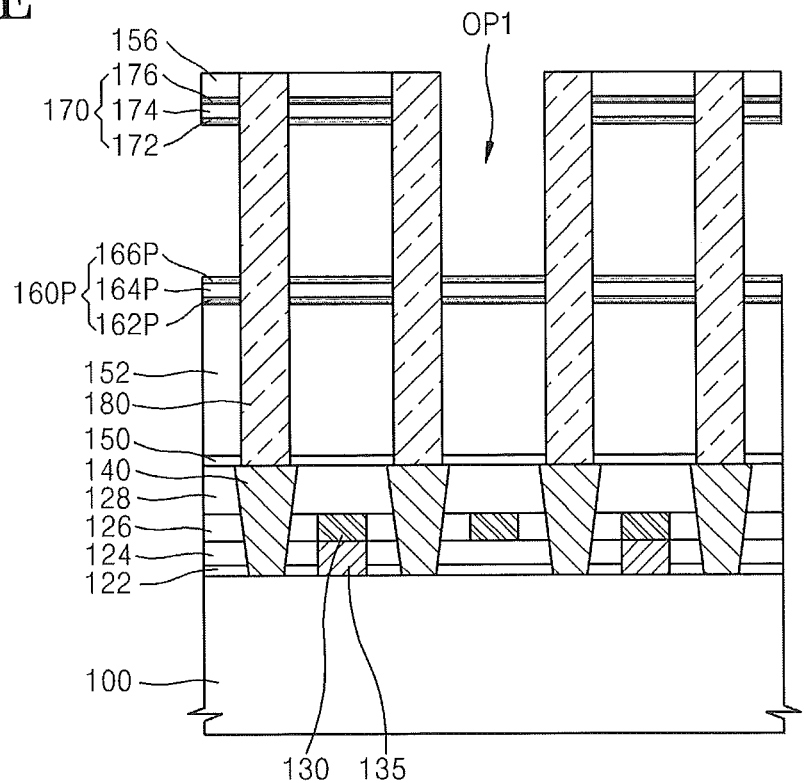

Referring to FIG. 3E, the second mold layer 154 is removed. The second mold layer 154 may be selectively removed by contacting or introducing an etchant via the open region OP1. For example, if the second mold layer 154 is formed of silicon, the etchant may be an $NH_4OH$ solution. After etching the second mold layer 154 exposed through the open region OP1, the etchant extends to the side of the open region OP1 to remove substantially all of the second mold layer 154. However, as the first and second support patterns 160P and 170P are formed of a material having an etching selectivity with respect to the second mold layer 154, the second mold layer may be removed without substantially etching the first and second support patterns 160P and 170P.

Figure 3F:
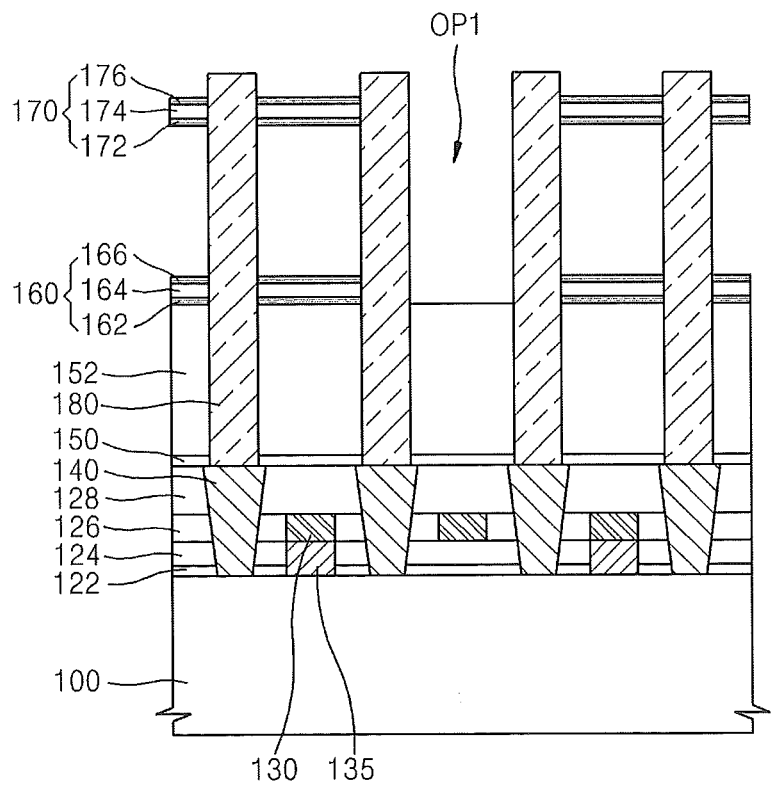

Referring to FIG. 3F, a portion of the first support pattern 160P in the open region OP1 is removed. The removing may be performed via dry etching. Here, the removing may be performed without a separate mask pattern. In this case, the hard mask layer 156 at the top is removed in regions other than the open region OP1, and the first support pattern 160P may be removed only in the open region OP1. Accordingly, while forming the hard mask layer 156 described above with reference to FIG. 3A, a thickness of the hard mask layer 156 may be determined considering the removing of the first support pattern 160P in the open region OP1. In other words, the thickness of the hard mask layer 156 may be selected such that the hard mask layer 156 is not removed until the first support pattern 160P in the open region OP 1 is completely removed. If the hard mask layer 156 remains, the remaining hard mask layer 156 may be removed via an additional process. As such, the first support unit 160 is formed by removing the portion of the first support pattern 160P, and a part of the first mold layer 152 is exposed via the open region OP1.

Figure 3G:
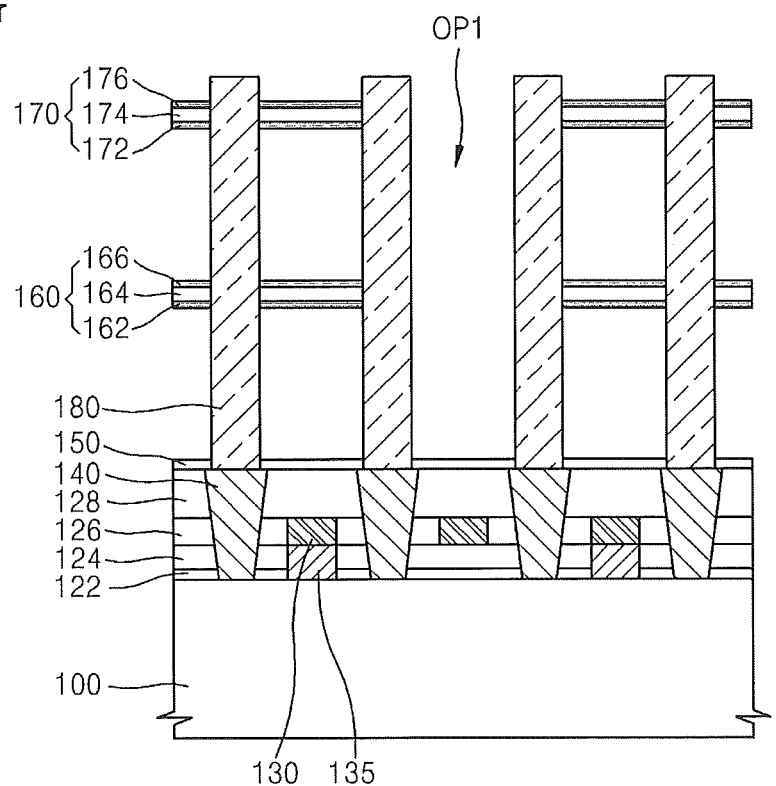

Referring to FIG. 3G, the first mold layer 152 is removed. The first mold layer 152 may be selectively removed by contacting or introducing an etchant through the open region OP1. If the first mold layer 152 is formed of silicon, the etchant may be an $NH_4OH$ solution. The etchant may etch the first mold layer 152 exposed through the open region OP1, gradually extend to the side of the open region OP1, and completely remove the first mold layer 152. However, as the first and second support units 160 and 170 are formed of a material having an etching selectivity with respect to the first mold layer 152, the first mold layer 152 may be removed without substantially etching the first and second support units 160 and 170.

Even after the first mold layer 152 is removed, the electrode structures 180 having a high aspect ratio may not be significantly tilted due to the presence of the first and second support units 160 and 170. Also, since the first and second support units 160 and 170 include metal oxide, the first and second support units 160 and 170 are strongly adhered to the electrode structures 180 to maintain the perpendicular orientation of the electrode structures 180 with respect to the substrate surface.

Figure 3H:
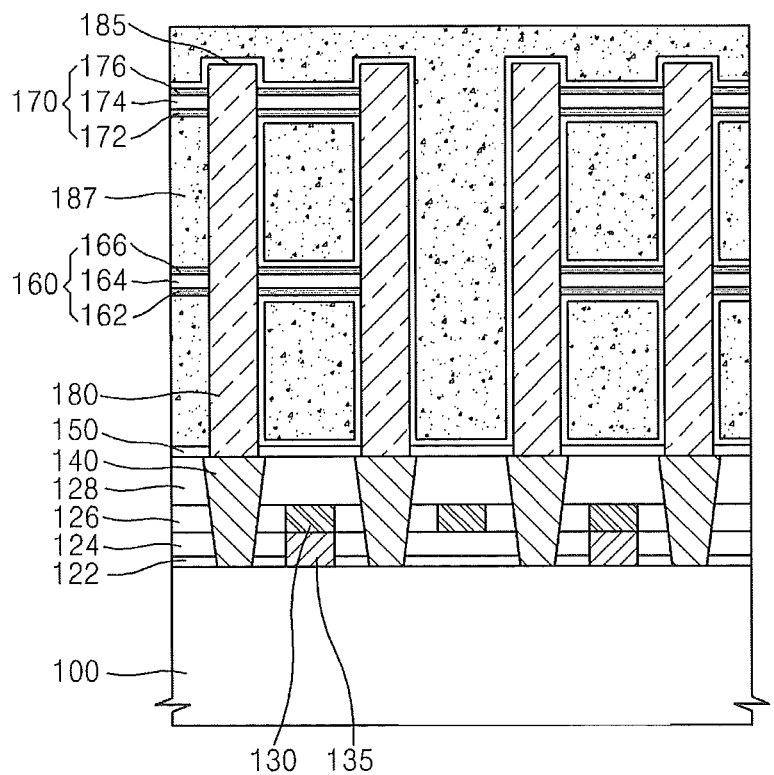

Referring to FIG. 3H, a dielectric layer 185 and an upper electrode 187 are sequentially formed on exposed surfaces of the electrode structures 180, the first support unit 160, the second support unit 170, and the etch stop layer 150. The dielectric layer 185 may include a material having a high dielectric constant, such as $ZrO_2$, $Al_2O_3$, and $Hf_2O_3$. The dielectric layer 185 may include a complex layer including at least two layers of the material having the high dielectric constant. The upper electrode 187 may be formed of at least one of doped polysilicon, TiN, W, Ti, Ru, and WN. The upper electrode 187 may also include a complex layer including at least two layers. The electrode structure 180, the dielectric layer 185, and the upper electrode 187 may form a capacitor of a semiconductor device.

Figure 5:
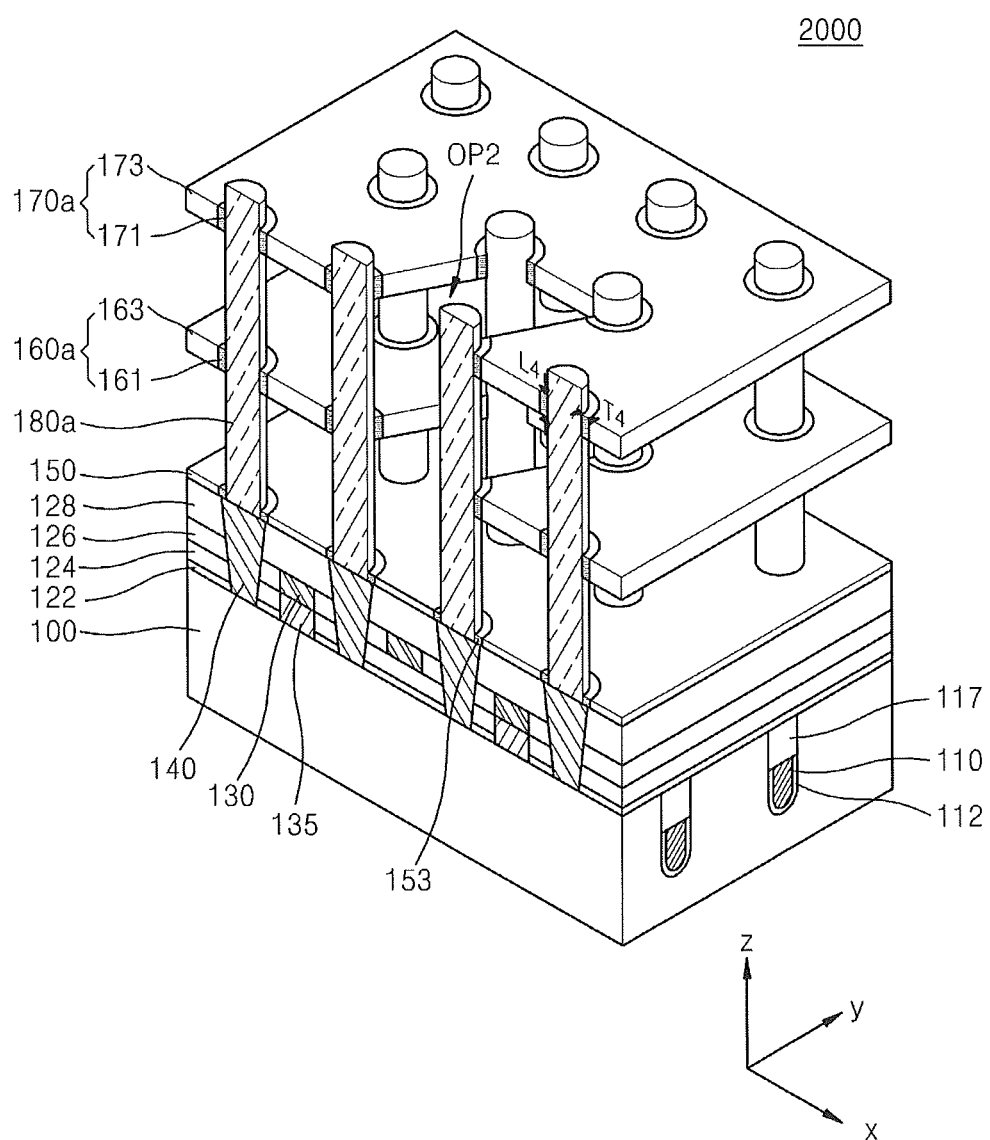
FIG. 5 is a perspective view schematically illustrating the semiconductor device of FIG. 4.

FIG. 4 is a plan view schematically illustrating an arrangement of electrode structures 180a and a first support unit 160a of a semiconductor device 2000, according to further embodiments of the inventive concept. FIG. 5 is a perspective view schematically illustrating the semiconductor device 2000 of FIG. 4. In FIGS. 4 and 5, elements having the same shapes as those in FIGS. 1 and 2 are denoted by the same reference numerals, and details thereof will not be repeated for brevity.

Referring to FIGS. 4 and 5, the semiconductor device 2000 includes the plurality of gate lines 110 in the substrate 100, the plurality of bit lines 130, and the plurality of electrode structures 180a. As shown in FIG. 4, the electrode structures 180a may be repeatedly arranged on the substrate 100 in an x-direction and a y-direction. The electrode structures 180a may be spaced apart from each other at a predetermined interval in the x-direction and may be misaligned in the y-direction (that is, arranged at an angle with respect to the y-direction).

The first support unit 160a and a second support unit 170a may be disposed between the electrode structures 180a, The first and second support units 160a and 170a support the electrode structures 180a by partially contacting the sides or sidewalls of each electrode structure 180a. The first and second support units 160a and 170a may have a planar or plate shape extending substantially parallel to the substrate 100 at predetermined heights (e.g., distances from the substrate surface) along the electrode structure 180a.

The first and second support units 160a and 170a may include an open region OP2. The open region OP2 may be repeatedly and regularly formed in the first and second support units 160a and 170a. In the embodiments of FIGS. 4 and 5, the open region OP2 may have a parallelogram shape.

The first and second support units 160a and 170a may respectively include first support layers 161 and 171 contacting the electrode structure 180a, and second support layers 163 and 173 that are spaced apart or separated from the electrode structures 180a by the first support layers 161 and 171. Lengths or thicknesses L4 of the first support layers 161 and 171 in a z-direction are identical to those of the second support layers 163 and 173 in FIG. 5, but alternatively, the lengths L4 may be longer than those of the second support layers 163 and 173. In other words, top surface and/or bottom surfaces of the first support layers 161 and 171 may protrude above and/or below surfaces of the second support layers 163 and 173.

The first and second support units 160a and 170a may include a material that is not substantially etched while wet-etching a mold material for forming the electrode structures 180a (e.g., a material having an etching selectivity with respect to the mold material). For example, if the mold material includes silicon, the first and second support units 160a and 170a may include a material having a lower etch rate than silicon with respect to an $NH_4OH$ solution used as an etchant.

The first support layers 161 and 171 may include metal oxide. The metal oxide may be at least one of TiO, TaO, TaTiO, TaSiO, and AlO, and may be at least partially non-crystalline. If the electrode structure 180a includes $RuO_2$, the metal oxide may improve an adhesive characteristic with respect to the $RuO_2$. Also, if noncrystalline metal oxide is used, a leakage current of the semiconductor device 2000 may be reduced. If the first support layers 161 and 171 include metal oxide, side thicknesses T4 of the first support layers 161 and 171 may be in the range of about 10 Å to about 200 Å, for example, about 100 Å.

The second support layers 163 and 173 may be formed of a material different from the first support layers 161 and 171. For example, the second support layers 163 and 173 may include at least one of SiO, SiN, SiCN, SiOC, SiON, and SiOCN.

FIGS. 6A through 6E are cross-sectional views for describing a method of manufacturing a semiconductor device, according to some embodiments of the inventive concept. FIGS. 6A through 6E are cross-sectional views taken along a line VI-VI' of FIG. 4.

Figure 6A:
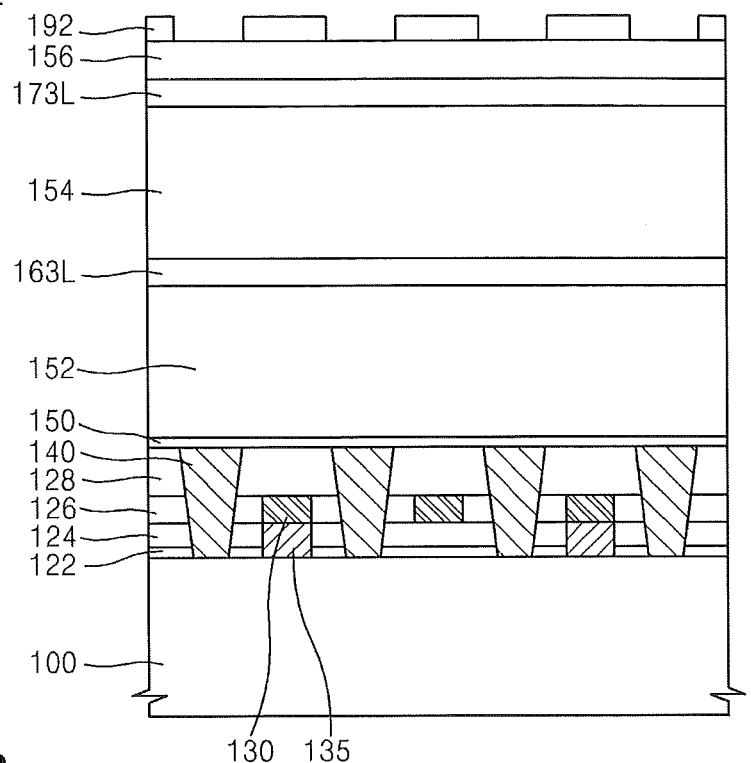
FIGS. 6A through 6E are cross-sectional views illustrating a method of manufacturing a semiconductor device, according to further embodiments of the inventive concept.

Referring to FIG. 6A, the substrate 100 where the gate lines 110 of FIG. 5, the bit lines 130, and the capacitor contact plugs 140 are formed is provided. A stacked structure where the etch stop layer 150, the first mold layer 152, a first support layer or plate 163L of the first support unit 160a of FIG. 5, the second mold layer 154, a second support layer or plate 173L of the second support unit 170a of FIG. 5, and the hard mask layer 156 are sequentially stacked is formed on the fourth insulation layer 128 and the capacitor contact plugs 140. The first mask pattern 192 for forming the electrode structure 180a of FIG. 5 may be formed on the stacked structure.

The first and second mold layers 152 and 154 may be formed of polysilicon or amorphous silicon. If the first and second mold layers 152 and 154 are formed of polysilicon, a follow-up photolithography process can be more easily performed since transmittance is relatively high, and an etch rate is relatively high while removing the first and second mold layers 152 and 154 in a subsequent process.

Here, if the first and second mold layers 152 and 154 are formed of polysilicon, the first and second mold layers 152 and 154 may be crystallized via a thermal process after forming an amorphous silicon layer. The thermal process may be performed at a temperature from about 600° C. to about 800° C. Alternatively, a separate thermal process may be omitted by depositing polysilicon at a temperature less than or equal to about 600° C. by using a low temperature crystallization process.

Figure 6B:
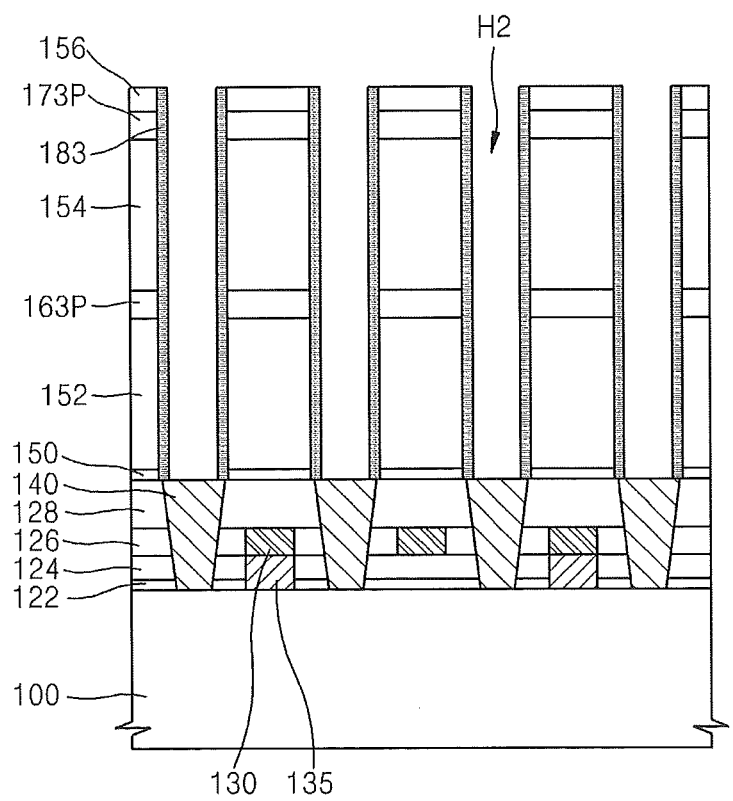

Referring to FIG. 6B, a plurality of second holes or openings H2 are formed by etching the hard mask layer 156, the second support film 173L, the second mold layer 154, the first support plate 163L, and the first mold layer 152, and the etch stop layer 150 at regions where the electrode structures 180 are to be formed until the capacitor plugs 140 are exposed. The etching of portions of the first and second support plates 163L and 173L define first and second support layer patterns 163P and 173P.

A metal oxide layer 183 is formed to have a spacer shape along sidewalls of the second holes H2. The metal oxide layer 183 is a layer for subsequently forming the first support layers 161 and 171 of FIG. 5.

Figure 6C:
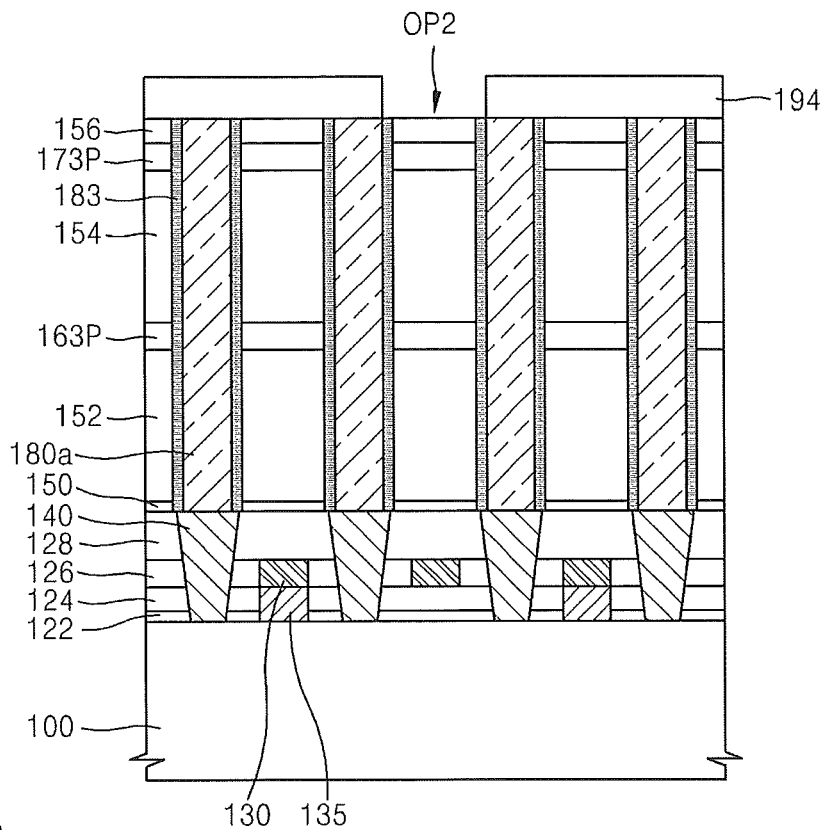

Referring to FIG. 6C, a conductive material is formed on the metal oxide layer 183 in the second holes H2 to define the electrode structures 180a in the second holes H2. The conductive material may include at least one of doped polysilicon, SiGe, TiN, W, Ti, Ru, and WN. Specifically, the electrode structures 180a may include a conductive oxide-based material, such as $RuO_x$. A second mask pattern 194 for forming the open region OP2 may be formed on the electrode structures 180a and the hard mask layer 156.

Figure 6D:
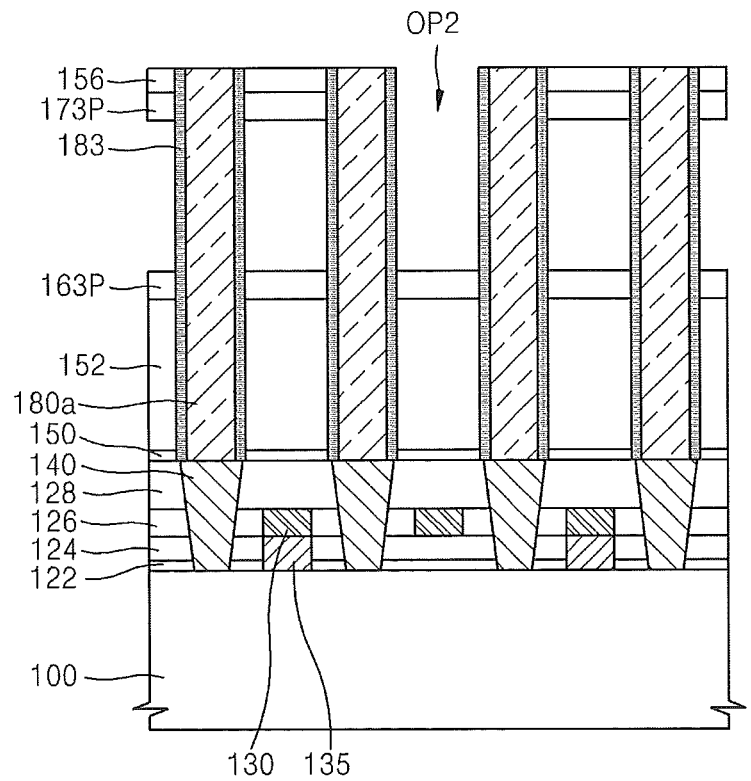

Referring to FIG. 6D, the second mask pattern 194 is used to remove the hard mask layer 156 and portions of the second support layer pattern 173P of the second support unit 170a of FIG. 5 that are exposed by the second mask pattern to define the opening OP2 in the second support layer 173. The removing may be performed via dry etching. The second support layer 173 of the second support unit 170a is formed via the removing, and part of the second mold layer 154 is exposed through the open region OP2.

The second mold layer 154 is then removed. The second mold layer 154 may be selectively removed by contacting or introducing an etchant through the open region OP2. If the second mold layer 154 is formed of silicon, the etchant may be a $NH_4OH$ solution. The etchant is used to etch the exposed second mold layer 154 through the open region OP2, and gradually extends to the side of the open region OP1 to completely remove the second mold layer 154. However, as the first and second support patterns 163P and 173P and the metal oxide layer 183 are formed of materials having an etching selectivity with respect to the second mold layer 154, the second mold layer may be removed without substantially etching the first and second support patterns 163P and 173P and the metal oxide layer 183.

Figure 6E:
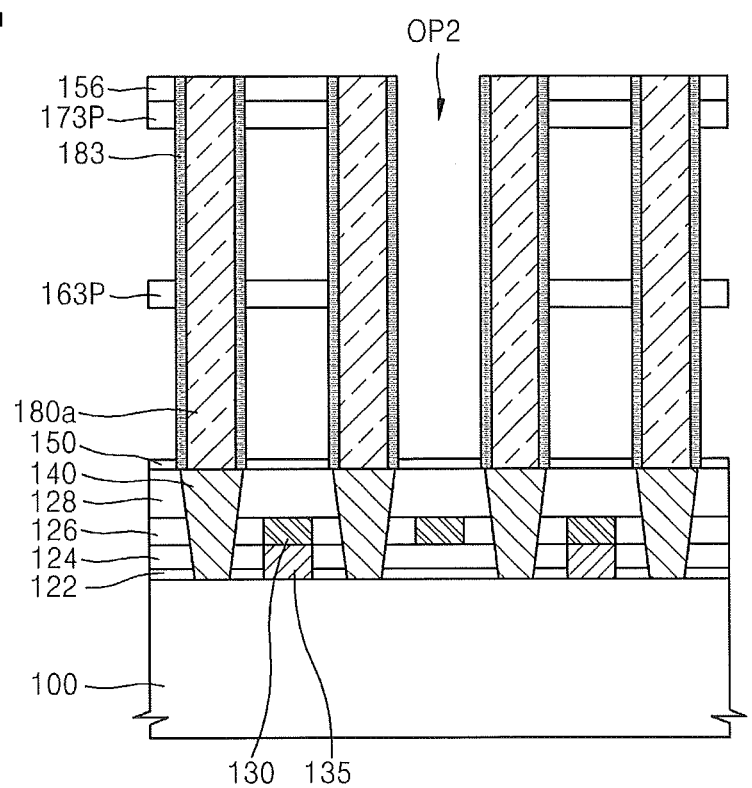

Referring to FIG. 6E, portions of the first support layer pattern 163P of the first support unit 160a of FIG. 5, which are exposed by removing the second mold layer 154, are also removed. The removing may be performed via dry etching. Here, the removing may be performed without a separate mask pattern. In this case, the hard mask layer 156 is removed at the top in regions outside the open region OP2, and the portions of the first support layer pattern 163P are removed only in the open region OP2. The first support layer 163 of the first support unit 160a is thus formed or defined via the removing. The first mold layer 152 exposed through the open region OP2 is then removed without substantially etching the first and second support patterns 163P and 173P and the metal oxide layer 183. The removing may be performed via selective wet etching.

Referring again to FIG. 5, portions of the metal oxide layer 183 that are exposed by removing the first and second mold layers 152 and 154 are also removed. The removing may be performed via selective wet etching. Accordingly, the metal oxide layer 183 remains between the electrode structures 180a and the second support layers 163 and 173, thereby forming the first support layers 161 and 171. The metal oxide layer 183 may also remain between the electrode structures 180a and the etch stop layer 150 to form a remaining support unit layer 153. The remaining support unit layer 153 may also support the electrode structure 180, together with the first support layers 161 and 171.

Alternatively, the metal oxide layer 183 may not be removed in some embodiments. In this case, the metal oxide layer 183 disposed between the electrode structures 180a and the second support layers 163 and 173 forms the first support layers 161 and 171, and other regions of the metal oxide layer 183 may form parts of a dielectric layer, such as the dielectric layer 185 of FIG. 3H, via a subsequent follow-up process. In addition, a capacitor of a semiconductor device may be formed by forming the dielectric layer 185 and the upper electrode 187 described above with reference to FIG. 3H FIGS. 7A through 7C are enlarged cross-sectional views of parts of semiconductor devices according to other embodiments of the inventive concept. Specifically, FIGS. 7A through 7C are enlarged cross-sectional views of the area S of FIG. 2.

Figure 7A:
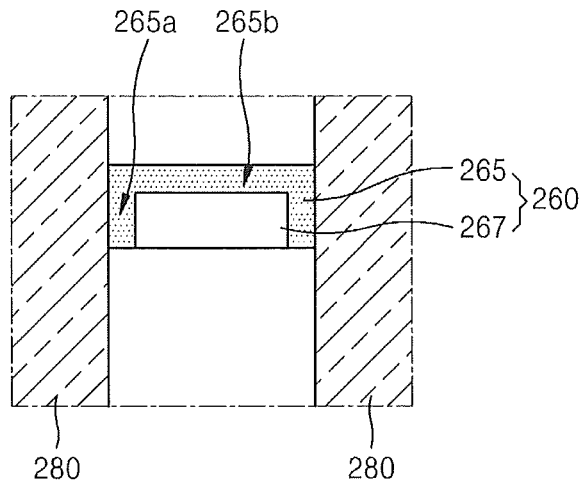
FIGS. 7A through 7C are cross-sectional views of parts of semiconductor devices according to still further embodiments of the inventive concept.
Figure 7B:
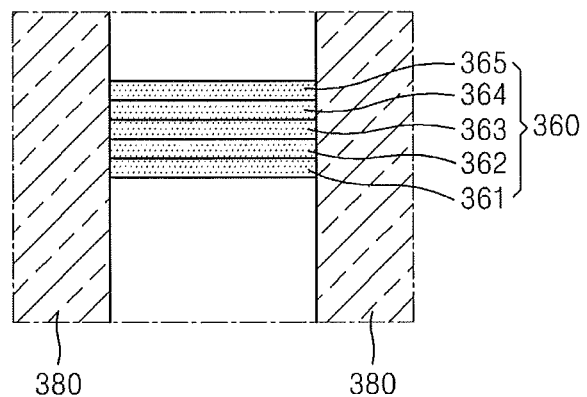
Figure 7C:
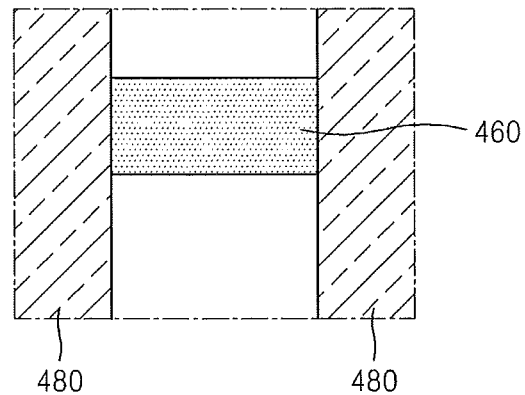

Referring to FIG. 7A, a support unit 260 includes a first support layer 265 and a second support layer 267. The first support layer 265 includes first regions 265a contacting electrode structures 280, and a second region 265b connecting parts of the first regions 265a between the adjacent electrode structures 280. The second support layer 267 is disposed to connect the first regions 265a that do not contact the second region 265b, below the second region 265b.

The first support layer 265 may include metal oxide. The metal oxide may be at least one of TiO, TaO, TaTiO, TaSiO, and AlO, and may be at least partially noncrystalline. The second support layer 267 may include a material different from the first support layer 265, and may include at least one of SiO, SiN, SiCN, SiOC, SiON, and SiOCN.

The support unit 260 in the embodiment of FIG. 7A may be manufactured by forming the first and second regions 265a and 265b of the first support layer 265 in another process. For example, the second support layer or plate 163L of FIG. 6A may be a double layer such that one layer forms the second support layer 267 and another layer forms the second region 265b of the first support layer 265. Also, as described with reference to FIGS. 6A through 6E, the metal oxide layer 183 may form the first region 265a of the first support layer 265, which contacts the sidewalls of the electrodes 280 and separates the second support layer 267 therefrom.

Referring to FIG. 7B, a further support unit 360 is disposed between electrode structures 380, and includes first through fifth support layers 361 through 365. The first through fifth support layers 361 through 365 may each have a thickness less than or equal to 100 Å. The first, third, and fifth support layers 361, 363, and 365 may include the same metal oxide. The metal oxide may be at least one of TiO, TaO, TaTiO, TaSiO, and AlO, and may be at least partially noncrystalline. The second and fourth support layers 362 and 364 may include metal oxide different from the first, third, and fifth support layers 361, 363, and 365. The metal oxide may be at least one of TiO, TaO, TaTiO, TaSiO, and AlO, and may be at least partially noncrystalline. For example, the first, third, and fifth support layers 361, 363, and 365 may be TiO, and the second and fourth support layers 362 and 364 may be TaO. The support unit 360 of FIG. 7B may be formed by stacking first and second support films 160L and 170L formed of 5 layers, for example, as similarly shown in the operation shown in FIG. 3A.

Referring to FIG. 7C, a still further support unit 460 is disposed between electrode structures 480, and may be formed of a single layer or film. The support unit 460 may have a thickness in the range from about 200 Å to about 500 Å. The support unit 460 may include metal oxide. The metal oxide may be at least one of TiO, TaO, TaTiO, TaSiO, and AlO. The metal oxide may be at least partially noncrystalline. Various operations or processes may be used so that the support unit 460 including a single film of a predetermined thickness or above is not crystallized while being manufactured.

For example, according to some embodiments, the first and second mold layers 152 and 154 may be formed by using polysilicon deposited at a temperature less than or equal to 600° C. via a low temperature crystallization process during the manufacturing process described above with reference to FIG. 3A. Here, a thermal budget of the entire process may be reduced by forming the first and second mold layers 152 and 154 at a low temperature. Accordingly, the support unit 460 may be prevented from being crystallized. Alternatively, the first and second mold layers 152 and 154 may be formed of amorphous silicon to omit a thermal process, thereby avoiding crystallization of the support unit 460.

According to other embodiments, the support unit 460 may be formed by doping the metal oxide with a heterogeneous element, such as a metal element or a silicon element, to increase its crystallization temperature in order to prevent crystallization. The crystallization temperature of the support unit 460 may be increased via doping. For example, the support unit 460 may be TaO doped with Ti, Al, or Si. Here, the first and second mold layers 152 and 154 may be deposited with amorphous silicon and then crystallized via a thermal process in the manufacturing process described above with reference to FIG. 3A. Since the support unit 460 can be a heterogeneous layer including heterogeneous element impurities, the support unit 460 may not be easily crystallized even if a subsequent thermal process is performed.

While the inventive concept has been particularly shown and described with reference to exemplary embodiments thereof, it will be understood that various changes in form and details may be made therein without departing from the spirit and scope of the following claims.

What is claimed is:

1. An integrated circuit device, comprising:
a plurality of electrode structures on a substrate and protruding from a surface thereof; and
a support unit comprising noncrystalline metal oxide spaced apart from the surface of the substrate, the support unit extending between ones of the electrode structures and contacting respective sidewalls thereof, wherein:
the support unit comprises a heterogeneous material including a dopant that is configured to increase a crystallization temperature of the metal oxide; or
the electrode structures conform to a shape of a mold structure, and the mold structure comprises amorphous silicon or polysilicon having a crystallization temperature less than that of the metal oxide.

2. The device of claim 1, wherein the support unit comprises a multi-layer structure, the multi-layer structure comprising a first layer including the metal oxide and a second layer comprising a material having a lower adhesive strength than the metal oxide with respect to the electrode structures.

3. The device of claim 2, wherein the first layer contacts the sidewalls of the electrode structures, and wherein the second layer is separated from the sidewalls of the electrode structures by the first layer.

4. The device of claim 1, wherein the support unit comprises a single layer of the metal oxide having a thickness sufficient to avoid crystallization thereof during deposition thereof.

5. A semiconductor device comprising:
a plurality of electrode structures perpendicularly extending relative to a surface of a substrate; and at least one support unit disposed between the plurality of electrode structures, the at least one support unit comprising at least one first support layer contacting a part of the plurality of electrode structures and comprising a noncrystalline metal oxide, and at least one second support layer contacting the at least one first support layer, wherein:

the at least one first support layer has a smaller thickness than the at least one second support layer; or the at least one first support layer has a thickness from about 10 Å to about 200 Å; or the at least one support unit comprises one of a plurality of the support units arranged at different distances from the substrate, at least one of the plurality of support units is disposed adjacent a top of the plurality of electrode structures, and the plurality of support units have different thicknesses.

6. The semiconductor device of claim 5, wherein the at least one first support layer and the at least one second support layer are alternately arranged.

7. The semiconductor device of claim 5, wherein the at least one support unit comprises a material having a lower etch rate than silicon with respect to an ammonium hydroxide ($NH_4OH$) solution.

8. The semiconductor device of claim 5, wherein the metal oxide comprises at least one of titanium oxide (TiO), tantalum oxide (TaO), aluminum oxide (AlO), tantalum titanium oxide (TaTiO), and tantalum silicon oxide (TaSiO).

9. The semiconductor device of claim 5, wherein the at least one second support layer comprises at least one of silicon oxide (SiO), silicon nitride (SiN), silicon carbon nitride (SiCN), silicon oxycarbide (SiOC), silicon oxynitride (SiON), and carbon doped silicon oxynitride (SiOCN).

10. The semiconductor device of claim 5, wherein the at least one second support layer comprises a metal oxide different from the at least one first support layer.

11. The semiconductor device of claim 5, wherein an adhesive strength between the at least one first support layer and the plurality of electrode structures is greater than that between the at least one second support layer and the plurality of electrode structures.

12. The semiconductor device of claim 5, wherein the plurality of electrode structures comprise ruthenium oxide.

13. The semiconductor device of claim 5, wherein the at least one first support layer comprises a plurality of first support layers comprising the metal oxide and contacting the part of the plurality of electrode structures, and wherein the least one second support layer contacts the plurality of first support layers and is spaced apart from the plurality of electrode structures.

14. The semiconductor device of claim 13, wherein the at least one support unit is disposed at a location spaced apart from opposing ends of the plurality of electrode structures in a direction perpendicular to the substrate.

15. A semiconductor device comprising:

a plurality of electrode structures perpendicularly extending relative to a surface of a substrate; and at least one support unit disposed between the plurality of electrode structures, the at least one support unit comprising at least one first support layer contacting a part of the plurality of electrode structures and comprising a noncrystalline metal oxide, and at least one second support layer contacting the at least one first support layer, wherein:

an adhesive strength between the at least one first support layer and the plurality of electrode structures is greater than that between the at least one second support layer and the plurality of electrode structures; or the plurality of electrode structures comprise ruthenium oxide; or the at least one support unit comprises a material having a lower etch rate than silicon with respect to an ammonium hydroxide ($NH_4OH$) solution.

* * * * *